(12) United States Patent
Juhn et al.

(10) Patent No.: US 7,562,275 B2
(45) Date of Patent: Jul. 14, 2009

(54) TRI-LEVEL TEST MODE TERMINAL IN LIMITED TERMINAL ENVIRONMENT

(75) Inventors: Richard Juhn, Nashua, NH (US); Douglas F. Pastorello, Hudson, NH (US)

(73) Assignee: Silicon Laboratories Inc., Austin, TX (US)

( * ) Notice: Subject to any disclaimer, the term of this patent is extended or adjusted under 35 U.S.C. 154(b) by 370 days.

(21) Appl. No.: 11/531,832

(22) Filed: Sep. 14, 2006

(65) Prior Publication Data

US 2008/0091992 A1    Apr. 17, 2008

(51) Int. Cl.
*G01R 31/28* (2006.01)
*H03K 19/00* (2006.01)

(52) U.S. Cl. .................. 714/726; 714/724; 714/729; 326/60

(58) Field of Classification Search ............ 714/726, 714/729; 326/60
See application file for complete search history.

(56) References Cited

U.S. PATENT DOCUMENTS

| 3,969,633 | A | | 7/1976 | Paluck et al. | |
|---|---|---|---|---|---|
| 4,667,338 | A | * | 5/1987 | Toyonaga et al. | 377/45 |
| 5,045,728 | A | * | 9/1991 | Crafts | 326/60 |
| 2006/0020864 | A1 | * | 1/2006 | Turner et al. | 714/726 |

* cited by examiner

*Primary Examiner*—John J Tabone, Jr.
(74) *Attorney, Agent, or Firm*—Zagorin O'Brien Graham LLP

(57) ABSTRACT

A technique for increasing functionality of terminals of an integrated circuit without increasing the number of terminals of the integrated circuit utilizes at least one tri-level terminal and converter circuit that provides a logic level indicative of a test mode of the integrated circuit in response to a corresponding input level. The technique substantially reduces or eliminates false detections of the test mode and substantially reduces or eliminates falsely enabling other (e.g., functional) mode(s) of the integrated circuit.

20 Claims, 2 Drawing Sheets

TRI-LEVEL TEST MODE TERMINAL IN LIMITED TERMINAL ENVIRONMENT

CROSS-REFERENCE TO RELATED APPLICATION(S)

BACKGROUND

1. Field Of The Invention

The present invention relates to integrated circuits, and more particularly to integrated circuits incorporating test modes.

2. Description Of The Related Art

Terminals on an integrated circuit communicate power supply signals and logic information between an integrated circuit and external circuitry. The number of terminals available to a particular integrated circuit may be limited by a target die size or a target package, which may be determined by cost, power considerations, or other factors. Accordingly, techniques that increase the functionality of a limited number of terminals of an integrated circuit are desired.

SUMMARY

A technique for increasing functionality of terminals of an integrated circuit without increasing the number of terminals of the integrated circuit utilizes at least one tri-level terminal and converter circuit (i.e., a terminal and converter circuit that is responsive to three input levels to provide three logic states) that provides a logic level indicative of a test mode of the integrated circuit in response to a corresponding input level. The technique substantially reduces or eliminates false detections of the test mode and substantially reduces or eliminates falsely enabling other (e.g., functional) mode(s) of the integrated circuit. In at least one embodiment of the invention, an integrated circuit includes a terminal and converter circuit responsive to provide at least two digital signals indicating one logic level of at least three logic levels. The at least two digital signals are based at least in part on a level of a signal received on the terminal. The at least three logic levels include a logic level indicative of a test mode of the integrated circuit. The at least two digital signals transition between at least two others of the at least three logic levels during another mode of the integrated circuit.

In at least one embodiment of the invention, a method includes determining a state of a test mode enable signal corresponding to a test mode of an integrated circuit based at least in part on a signal received on a terminal of the integrated circuit. The received signal has a level corresponding to one logic state of at least three logic states and the state of the test mode enable signal is determined to be one of the at least three logic states. The signal transitions between levels corresponding to at least two others of the at least three logic states during another mode of the integrated circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

A typical integrated circuit may include a limited number of terminals. As referred to herein, a terminal is a device that provides input, output, or input/output facilities to an integrated circuit. For example, a terminal may be a pin, an interconnecting lead or wire, or other conductive structure for interconnecting an integrated circuit to external circuitry. The terminal may be coupled to pads, electrostatic discharge (ESD) circuitry, or termination circuitry. An individual terminal may be coupled to a converter circuit to form a terminal and converter circuit. Typically, the terminal and converter circuit receives a voltage level over the terminal and converts the voltage level into a corresponding one of two logic levels. A tri-level terminal and converter circuit receives a voltage level over a particular terminal and converts the voltage level into a corresponding one of three logic levels.

Figure 1:
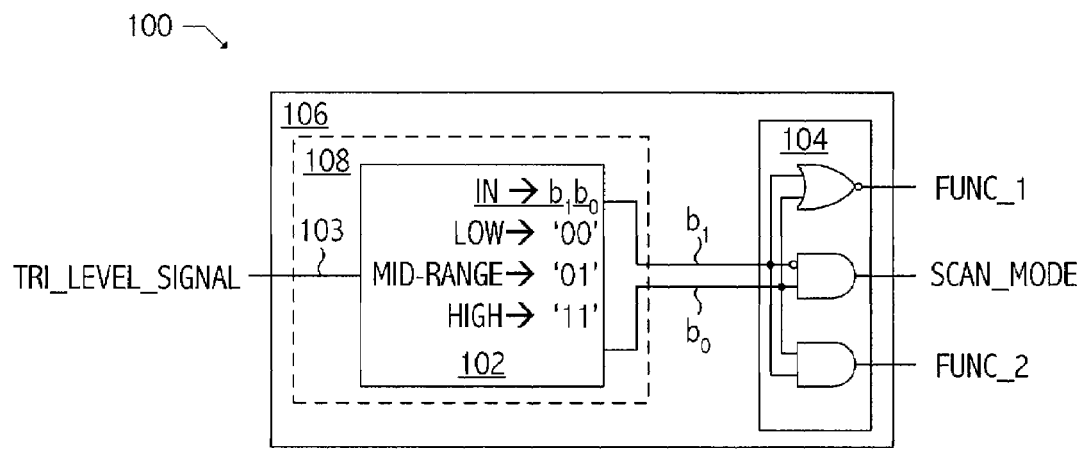
FIG. 1 is a block diagram of an integrated circuit including a tri-level terminal and converter circuit consistent with at least one embodiment of the present invention.

Referring to FIG. 1, exemplary integrated circuit 100 includes a tri-level terminal and converter circuit (e.g., terminal and converter circuit 106, which includes terminal 103 and converter circuit 102) that receives an input signal (e.g., TRI_LEVEL_SIGNAL) and converts the voltage level of the input signal into a corresponding one of three logic levels, which is represented by two binary-coded bits (e.g., bits $b_1$ and $b_0$). Bits $b_1$ and $b_0$ are decoded (e.g., by circuit 104) to determine states of a core circuit. For example, when bits $b_1$ and $b_0$ are '01,' the integrated circuit is in a test mode (e.g., scan mode) and a corresponding test mode enable signal (e.g., SCAN_MODE) is configured to be indicative thereof When the voltage level of the input signal transitions from a low level to a high level, the voltage level of the input signal may pass through a middle voltage level and converter circuit 102 may detect that transient value of the input signal and enable the test mode, at least temporarily. In addition, converter circuit 102 may temporarily set a binary output to a first logic level when transitioning from a second logic level to a third logic level. For example, in at least one embodiment of integrated circuit 100, when TRI_LEVEL_SIGNAL has a low level, $b_1$ and $b_0$ are '00,' and a functional control signal (e.g., FUNC_1) is enabled, which may select a first clock as a clock source. When TRI_LEVEL_SIGNAL has a high level, $b_1$ and $b_0$ are '11,' and a functional control signal (e.g., FUNC_2) is enabled, which, in at least one embodiment of integrated circuit 100, selects a second clock as a clock source. When transitioning from enabling the first clock as the clock source to enabling the second clock as the clock source, the input signal transitions from a low voltage level to a high voltage level and the input signal passes through the middle voltage level. Note that since the middle voltage level of the input signal corresponds to the test mode, when the input signal transitions from a low level to the high level, the test mode may inadvertently be enabled for a short period of time, i.e., the test mode enable signal includes a glitch.

Figure 2:
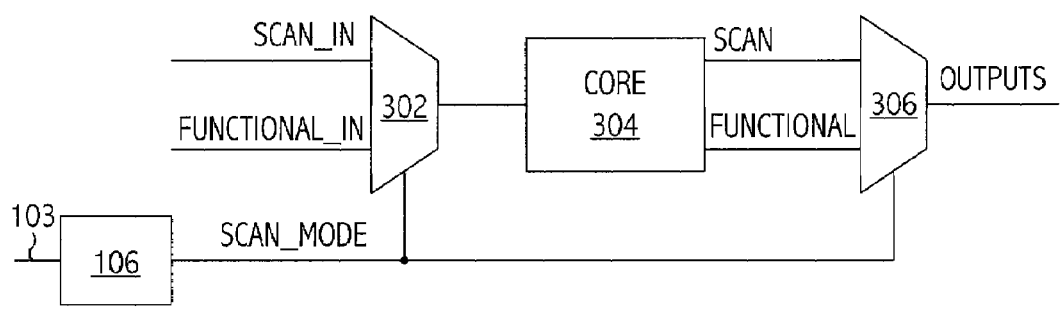
FIG. 2 is a block diagram of portions of an integrated circuit having a test mode and a functional mode consistent with at least one embodiment of the present invention.

Referring to FIG. 2, an exemplary test mode enable signal (e.g., SCAN_MODE) is configured to select (e.g., by multiplexer 302) between functional inputs to core circuit 304 (e.g., FUNCTIONAL_IN) and test mode inputs to core circuit 304 (e.g., SCAN_IN). As referred to herein, a functional mode of an integrated circuit is a mode in which the integrated circuit is configured to perform a specified set of operations associated with a non-test mode. In contrast, in a test mode, the integrated circuit is configured to exercise the circuitry for diagnostic purposes, test data and/or control information is delivered to internal circuits under test, and outputs of the internal circuits are observed internally or externally. For example, scan design configures state elements (e.g., registers, flip-flops, and latches) into one or more scan chains (i.e., state elements configured as shift registers), which are used to gain access to internal nodes of the integrated circuit. Test patterns are shifted into the state elements via the one or more scan chain and clock signals are pulsed to test the integrated circuit, e.g., during one or more capture cycles. The results are then shifted out to terminals of the integrated circuit and compared against expected results. The test mode enable signal selects (e.g., by multiplexer 306) between functional outputs from core circuit 304 (e.g., FUNCTIONAL) and test outputs from core circuit 304 (e.g., SCAN). If SCAN_MODE is temporarily and erroneously enabled, then core circuit 304 receives incorrect inputs and the integrated circuit provides incorrect outputs, thus corrupting the state of core circuit 304.

Figure 3:
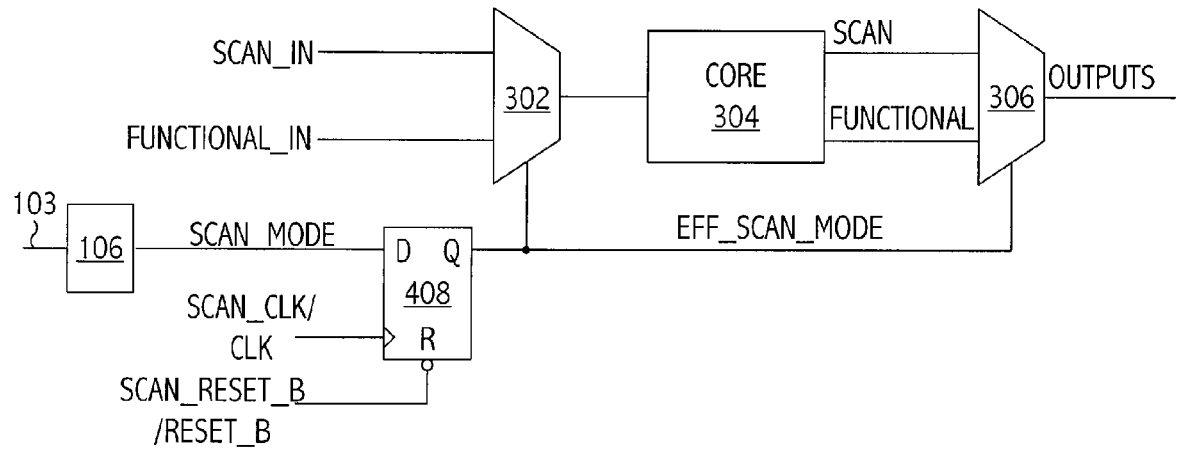
FIG. 3 is a block diagram of portions of an integrated circuit having a test mode and a functional mode consistent with at least one embodiment of the present invention.

Referring to FIG. 3, in at least one embodiment of integrated circuit 100, a technique for reducing or substantially eliminating effects of the transition of the input signal through the test mode, stores the test mode enable signal (e.g., SCAN_MODE, which is based on an input signal received on tri-level terminal 103) in exemplary flip-flop 408 to generate an effective test mode enable signal (e.g., EFF_SCAN_MODE). Due to a limited number of terminals on integrated circuit 100, flip-flop 408 may be clocked by a signal received on a terminal shared by a test mode clock signal (e.g., SCAN_CLK) and a functional mode clock signal (e.g., CLK). In addition, flip-flop 408 may be reset by a control signal received on a terminal shared by a test mode reset signal (e.g., SCAN_RESET_B) and a functional mode reset signal (e.g., RESET_B). When the test mode is enabled and state elements are reset (e.g., SCAN_RESET_B='0'), flip-flop 408 resets and EFF_SCAN_MODE disables the test mode. Thus, the integrated circuit may enter a functional mode during a test mode, thereby corrupting the state of core circuit 304. In at least one embodiment of integrated circuit 100, the test mode clock signal is received on a dedicated terminal. Rather than gating the test mode clock signal supplied to flip-flop 408 with the effective test mode signal, which is problematic because it forms a loop, the test mode clock signal may be provided directly to core circuit 304 and the clock input to flip-flop 408 may be effectively disabled in the test mode.

Figure 4:
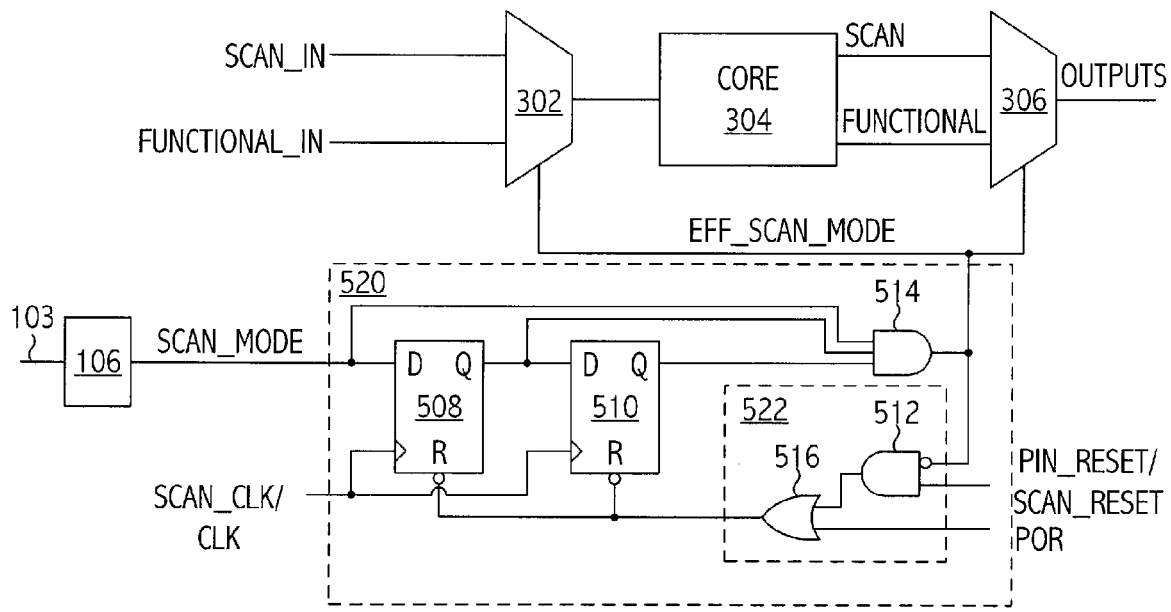
FIG. 4 is a block diagram of portions of an integrated circuit having a test mode and a functional mode consistent with at least one embodiment of the present invention.

Referring to FIG. 4, in at least one embodiment of integrated circuit 100, a plurality of state elements (e.g., flip-flops 508 and 510) are used to generate an effective test mode enable signal (e.g., EFF_SCAN_MODE) that is substantially immune to glitches in the test mode enable signal (e.g., SCAN_MODE, which is based on an input signal received on tri-level terminal 103). The probability of glitches on the test mode enable signal may be even further reduced by including additional state elements. Note that in at least one embodiment of integrated circuit 100, all terminals associated with test mode signals are shared with functional signals that are not used during the test mode. However, in other embodiments, only a portion of the test mode signals may share a terminal with functional signals that are not used during the test mode. The functional signals that share terminals with particular test mode signals may be determined according to signal speed. For example, a functional signal sharing a terminal with SCAN_CLK having a faster rate than a functional signal sharing a terminal with SCAN_MODE may substantially reduce or eliminate the likelihood of glitches in the EFF_SCAN_MODE signal.

In at least one embodiment of integrated circuit 100, a shared functional mode reset (e.g., PIN_RESET), which shares a terminal with a test mode reset signal (e.g., SCAN_RESET), is blocked when the test mode is enabled (i.e., the test mode enable signal indicates that the test mode is enabled, e.g., EFF_SCAN_MODE='1'). However, an internally generated power-on-reset signal (e.g., POR) may reset the plurality of state elements configured to generate the effective test mode enable signal, irrespective of whether the test mode is enabled, at least during an initial power on of integrated circuit 100. Power-on-reset of flip-flops 508 and 510, or other suitable technique, prevents integrated circuit 100 from entering the test mode upon powering on the integrated circuit due to an unknown state of the plurality of state elements. In at least one embodiment of integrated circuit 100, deglitching circuit 520 resets state elements based on a power-on-reset signal without the use of a reset terminal. However, in at least one application, the power-on-reset signal may not be reliable and a reset terminal (e.g., PIN_RESET/SCAN_RESET) is used. In at least one embodiment of integrated circuit 100, the reset terminal effectively resets the deglitching state elements only when the test mode is disabled (e.g., EFF_SCAN_MODE='0').

Note that deglitching circuit 520 and circuit 522 are exemplary implementations of a test mode signal deglitching circuit (e.g., flip-flop 508, flip-flop 510, and logic gate 514) and reset control logic (e.g., circuit 522). Those circuits may vary with signal polarity (e.g. whether a particular signal is active high or active low), and with the types of signals shared by a particular terminal. In addition, various distinct combinations of logic gates (e.g., AND, OR, NOR, XOR, etc.) may perform effectively the same as functions as logic gates 514, 512, and 516, and the invention is not limited to a particular combination of logic gates. The invention described herein is not limited to a particular circuit technique. For example, a particular circuit may be implemented by traditional CMOS logic, current mode logic, bipolar logic, other suitable techniques, or any combination thereof.

While circuits and physical structures are generally presumed, it is well recognized that in modern semiconductor design and fabrication, physical structures and circuits may be embodied in computer-readable descriptive form suitable for use in subsequent design, test or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer-readable medium includes at least disk, tape, or other magnetic, optical, semiconductor (e.g., flash memory cards, ROM), or electronic medium.

The description of the invention set forth herein is illustrative, and is not intended to limit the scope of the invention as set forth in the following claims. For example, while the invention has been described in an embodiment including a functional mode and a test mode, one of skill in the art will appreciate that the teachings herein can be utilized in embodiments in which one or more terminals used by a functional mode are shared with additional functional modes or other types of modes of the integrated circuit. In addition, while the invention has been described in an embodiment including a tri-level terminal and converter circuit, one of skill in the art will appreciate that the teachings herein can be utilized in embodiments in which a terminal and converter circuit is responsive to three or more levels. Variations and modifications of the embodiments disclosed herein, may be made based on the description set forth herein, without departing from the scope and spirit of the invention as set forth in the following claims.

What is claimed is:

1. An integrated circuit comprising:

a terminal; and a converter circuit responsive to provide at least two digital signals indicating one logic level of at least three logic levels, the at least two digital signals being based at least in part on a level of a signal received on the terminal, the at least three logic levels including a logic level indicative of a test mode of the integrated circuit, and a deglitching circuit responsive to provide a deglitched version of a test mode enable signal based at least in part on a clock signal, a reset signal, and the test mode enable signal, wherein the at least two digital signals transition between at least two others of the at least three logic levels during another mode of the integrated circuit, wherein the test mode enable signal is based at least in part on the at least two digital signals.

2. The integrated circuit, as recited in claim 1, wherein the test mode is a scan mode.

3. The integrated circuit, as recited in claim 1, wherein the converter circuit is responsive to convert three signal levels to respective ones of three logic levels and the scan mode corresponds to a middle signal level of the three signal levels.

4. The integrated circuit, as recited in claim 1, wherein the converter circuit is responsive to convert three signal levels to respective ones of three logic levels and the scan mode corresponds to a middle logic level of the three logic levels.

5. The integrated circuit, as recited in claim 4, wherein the three logic levels are binary logic levels '00', '11', and one of '01' and '10' and the test mode corresponds to the one of '01' and '10.'

6. The integrated circuit, as recited in claim 1, wherein the deglitched version of the test mode enable signal maintains a disabled state of the test mode during transitions of the at least two digital signals and maintains an enabled state of the test mode while the test mode is enabled and during transitions of the at least one reset signal.

7. The integrated circuit, as recited in claim 1, wherein the test mode is a scan mode and the deglitching circuit comprises at least one state element that is excluded from scan chains configured in the scan mode.

8. The integrated circuit, as recited in claim 1, wherein the deglitching circuit comprises reset circuitry for preventing reset during the test mode of at least one state element within the deglitching circuit based at least in part on the reset signal.

9. The integrated circuit, as recited in claim 1, wherein the test mode enable signal toggles less frequently than the clock signal used to deglitch the test mode enable signal.

10. The integrated circuit, as recited in claim 1, further comprising:
a second terminal, the second terminal being shared between a test mode reset signal and a functional mode reset signal, the at least one reset signal being based at least in part on a signal received by the second terminal.

11. The integrated circuit, as recited in claim 1, further comprising:
a third terminal, the third terminal being shared between a test clock signal and a functional clock signal, the at least one clock signal being based at least in part on a signal received by the third terminal.

12. The integrated circuit, as recited in claim 1, wherein at least two of the at least three signal levels correspond to logic levels indicative of at least one functional mode.

13. A method comprising:
determining a state of a test mode enable signal corresponding to a test mode of an integrated circuit based at least in part on a signal received on a terminal of the integrated circuit, a clock signal, and a reset signal, wherein the determining comprises:

converting the received signal into at least two digital signals based at least in part on a level of the received signal;

determining the state of the test mode enable signal based at least in part on the at least two digital signals; and maintaining the state of the test mode enable signal while the test mode is enabled and during transient changes of the at least two digital signals based at least in part on the clock signal, the reset signal and the test mode enable signal, wherein the received signal has a level corresponding to one logic state of at least three logic states and the state of the test mode enable signal being determined to be one of the at least three logic states, wherein the signal transitions between levels corresponding to at least two others of the at least three logic states during another mode of the integrated circuit.

14. The method, as recited in claim 13, further comprising:
maintaining the state of the test mode enable signal while a test mode is enabled and during transitions of the reset signal.

15. The method, as recited in claim 13, further comprising:
transitioning the at least two digital signals from one of at least three logic levels to another of the at least three logic levels through a test mode enable logic level without effectively enabling the test mode.

16. The method, as recited in claim 13, wherein the test mode enable signal is a scan mode enable signal.

17. An apparatus comprising:
a terminal on an integrated circuit;
means for determining a state of a test mode enable signal corresponding to a test mode of the integrated circuit based at least in part on a signal received on the terminal, a clock signal, and a reset signal,
wherein the means for determining comprises:
means for converting the received signal into at least two digital signals based at least in part on a level of the received signal; and
means for maintaining the state of the test mode enable signal while the test mode is enabled and during transient changes of the at least two digital signals based at least in part on the clock signal, the reset signal and the test mode enable signal,
wherein the signal has one of at least three levels, the at least three levels corresponding to at least three logic states and the state of the test mode enable signal being determined to be one of the at least three logic states,
wherein the signal transitions between levels corresponding to at least two others of the at least three logic states during another mode of the integrated circuit.

18. The apparatus, as recited in claim 17, wherein the test mode enable signal is a scan mode enable signal.

19. The apparatus, as recited in claim 17, wherein a transition of the at least two digital signals from one of at least three logic levels to another of the at least three logic levels through a test mode enable logic level fails to enable the test mode.

20. The apparatus, as recited in claim 17, wherein the means for determining comprises:
means for maintaining the state of the test mode enable signal while a test mode is enabled and during transitions of a reset signal coupled to the means for determining.

* * * * *